United States Patent [19]

Davidson et al.

[11] Patent Number: 5,032,991

[45] Date of Patent: Jul. 16, 1991

[54] METHOD FOR ROUTING CONDUCTIVE PATHS

[75] Inventors: Scott Davidson, Pennington; Charles D. Hechtman, Hopewell; James L. Lewandowski; Daryl C. Lu, both of Plainsboro, all of N.J.

[73] Assignee: AT&T Bell Laboratories, Murray Hill, N.J.

[21] Appl. No.: 284,001

[22] Filed: Dec. 14, 1988

[51] Int. Cl.$^5$ .................. G06F 15/20; G06F 15/60
[52] U.S. Cl. .................. 364/490; 364/489; 364/488
[58] Field of Search ........... 364/488, 489, 490, 491

[56] References Cited

U.S. PATENT DOCUMENTS

| 3,681,782 | 8/1972 | Scanlon | 364/491 |
|---|---|---|---|
| 4,541,114 | 9/1985 | Rutenbar et al. | 364/491 |
| 4,615,011 | 9/1986 | Linsker | 364/491 |
| 4,636,965 | 1/1987 | Smith et al. | 364/491 |
| 4,754,408 | 6/1988 | Carpenter et al. | 364/491 |
| 4,777,606 | 10/1988 | Fournier | 364/491 |
| 4,852,015 | 7/1989 | Doyle, Jr. | 364/491 |
| 4,858,143 | 8/1989 | Fournier | 364/491 |
| 4,876,656 | 10/1989 | Leicht et al. | 364/491 |

OTHER PUBLICATIONS

"Automatic Wiring Procedure in Interactive Type Printed Substrate Design System", by M. Togashi et al., 30th National Conf. (First Half of 1985) of the Information Processing Society of Japan, pp. 1903–1904.

*Combinatorial Optimization: Algorithms and Complexity*, C. H. Papadimitriou and K. Steiglitz (Prentice-Hall, Inc., Englewood Cliffs, New Jersey, 1982) Chapter 10, pp. 219–246.

*Primary Examiner*—Felix D. Gruber
*Assistant Examiner*—V. N. Trans
*Attorney, Agent, or Firm*—Robert B. Levy

[57] ABSTRACT

The present disclosure is directed to a technique for assigning each of a plurality of test points (34) on a first surface of a translator board (24) to an appropriate one of a set of grid points (36) on an opposed surface of the board. Such an assignment is accomplished by first mapping the grid points (36) and a successive one of the test points (34) into an array (49a) of uniformly spaced cells (49b). An initial group of cells (49b), surrounding the mapped test point (34), is then searched to locate the four grid points (36) closest to the test point. Among the four closest grid points (36), the one which satisfies a particular constraint is designated. A check is then made to determine whether the designated grid point (36) is appropriate for the test point (34). If so, the grid point (36) is assigned to the test point (34) and the grid point is removed from the array before mapping the next test point. Otherwise, the designated grid point is disqualified, and the area searched is expanded in the direction of the now-disqualified grid point until an edge of the array is reached.

7 Claims, 3 Drawing Sheets

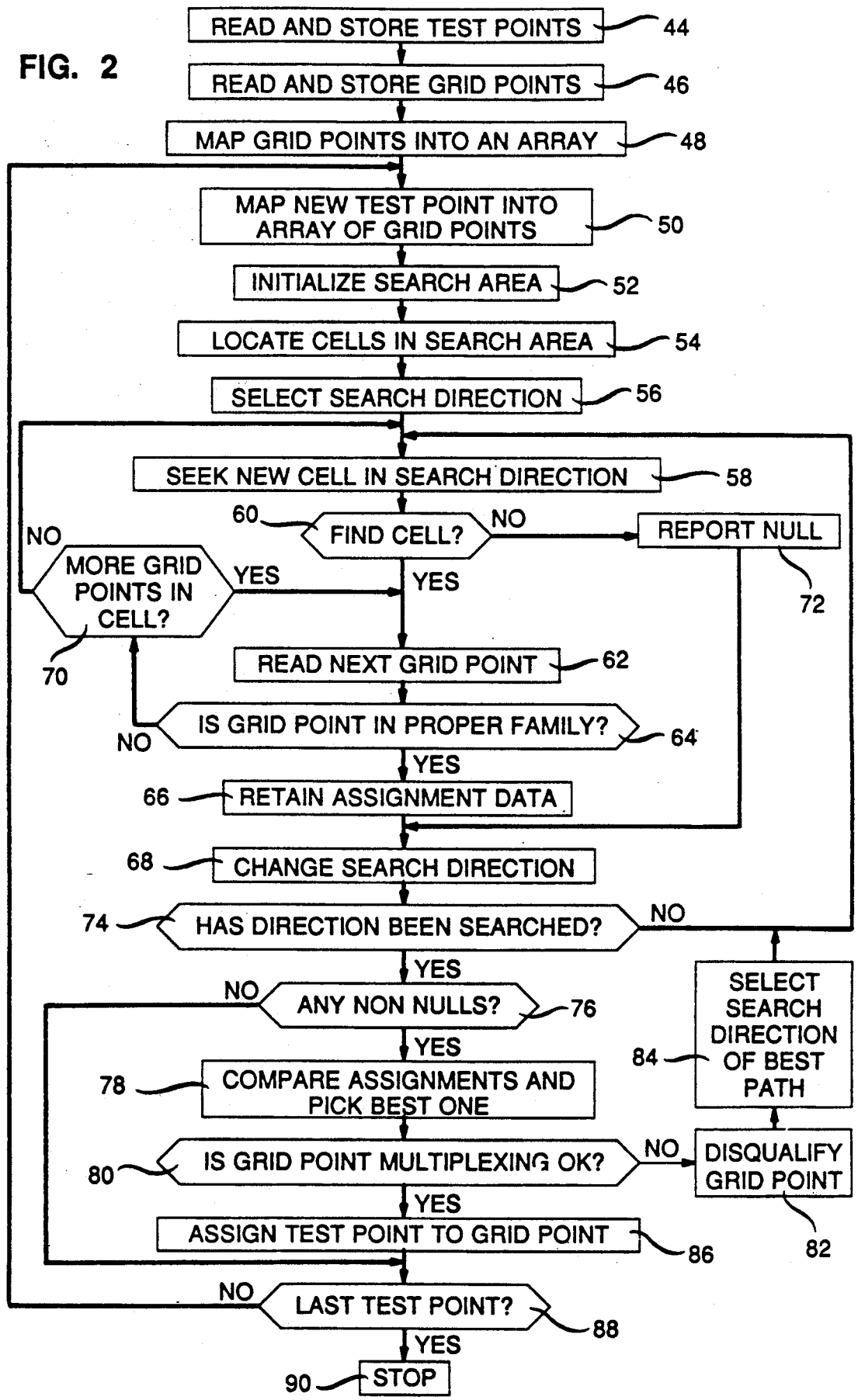

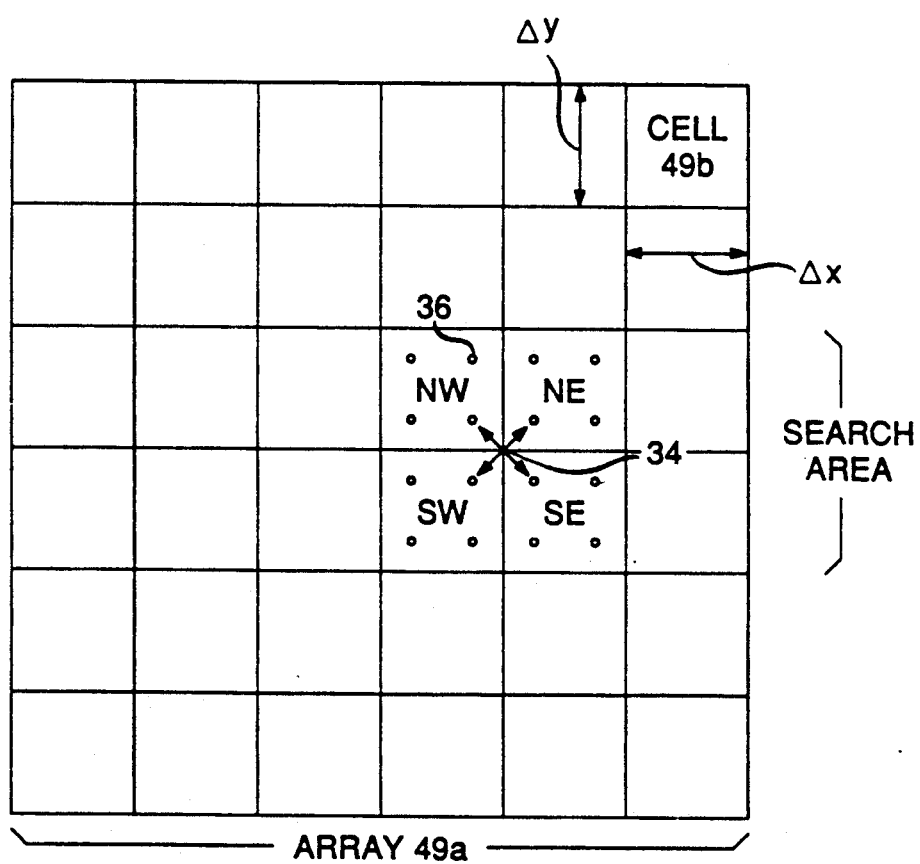

METHOD FOR ROUTING CONDUCTIVE PATHS

TECHNICAL FIELD

This invention relates to a method for assigning each of a plurality of test points on a substrate to an appropriate one of a set of grid points so that a conductive path can be routed therebetween.

BACKGROUND OF THE INVENTION

To electrically test a circuit board, a testing machine of a type well known in the art launches one or more test signals into the board through a test fixture and then recovers, via the fixture, the signal(s) generated in response to the test signals. Present day test fixtures for coupling a circuit board under test to a testing machine typically comprise two sets of electrically conductive pins or nails. The pins of the first set are arranged so each contacts a separate node on the circuit board while the pins of the second set are arranged so each contacts a separate one of a set of uniformly spaced contacts on the testing machine. Typically, the nodes on the circuit board are not uniformly spaced like the contacts on the testing machine so that some, if not all, of the pins of the first set are offset from the pins of the second set. In some instances the pins of the second set may be replaced by flexible metal connectors.

In a conventional test fixture, each pin of the first set is electrically coupled to a separate pin of the second set by a length of wire. Fixtures of this type, referred to as "wired fixtures", tend to incur poor performance at high frequencies (>10 MHz.) due to cross talk. Improved fixture performance can be obtained by utilizing a printed circuit board, referred to as a "translator board," rather than individual wires, to interconnect the pins of the first set to those of the second set. A typical translator board consists of two outer layers of insulative material (e.g., FR-4), in between which are sandwiched two inner layers of insulative material, each having conductive metallized paths thereon.

On the exposed surface of a first one of the outer layers are a set of metallized areas, hereinafter referred to as "test points" which are arranged to contact a separate one of the first set of pins. The exposed surface of the other outer layer is provided with a set of metallized areas, hereinafter referred to as "grid points," arranged to contact each of the second set of pins. Each test point is connected to an appropriate one of the grid points through the combination of a longitudinal and a latitudinal metallized path; each running orthogonal to the other on a major surface of a separate one of the pair inner layers of the translator board. The test points and grid points are each connected to a separate one of the longitudinal and latitudinal paths, respectively, by a separate one of a plurality of metal-plated vias. Each longitudinal path is linked to a latitudinal path by a metal-plated via as well.

The most difficult task in fabricating "translator board" type test fixtures is routing the translator board, that is, determining the geometry (i.e., the length and the locations) of the longitudinal and latitudinal paths so each test point is connected to an appropriate grid point. The length and location of each longitudinal and latitudinal path is dependent on the assignments (i.e., the pairings) of the test points and grid points. Once each test point has been assigned to an appropriate one of the grid points, the longitudinal and latitudinal paths can easily be routed on a separate one of the inner layers using a conventional channel routing program as is known in the art.

Assigning the test points to the grid points is not a trival task. In order to achieve good fixture performance at high frequencies, the composite path between each test point and grid point should be kept short. To this end, it is desirable for each test point to be assigned to the closest grid point. However, the grid point closest to the test point may not be connected to an appropriate contact on the testing machine. For example, the contact on the testing machine associated with the grid point closest to the test point may not be of the appropriate logic family for the node on the circuit board associated with the test point.

At the present time, assignment of the test points to the grid points is done on an ad hoc basis. As a consequence, there is no assurance that each test point is necessarily assigned to the closest appropriate grid point.

Thus, there is a need for an technique for assigning each of a plurality of test points on a substrate to an appropriate one of a set of grid point such that each test point is automatically assigned to the closest one of the grid points appropriate for the test point.

SUMMARY OF THE INVENTION

Briefly, in accordance with the invention, each of a set of test points on a substrate is assigned to an appropriate one of a set of grid points on the substrate by first mapping the grid points and a successive one of the test points into an array of uniformly sized cells. The grid points and the test point are mapped into the array in accordance with their location on the substrate. A search is then conducted within an area in the array initially encompassing a predetermined number of cells closest to the test point to locate each of a predetermined number of grid points closest to the test point. Among the closest grid points, the grid point which satisfies a predetermined constraint is initially designated. A check is then made whether the initially designated grid point is appropriate for the mapped test point. If so, the designated grid point is permanently assigned to the test point. Otherwise, the size of the search area is expanded by at least one cell lying in the direction along which the designated grid point had been found. After expanding the search area, the steps of (1) searching for the closest grid points, (2) designating the grid point which meets the minimization constraint, and (3) checking whether the newly-designated grid point is appropriate, are repeated. If necessary, the search area is expanded to encompass the entire grid array.

BRIEF DESCRIPTION OF THE DRAWING

FIG. 2 depicts a flow chart representation of a program, in accordance with the invention, for assigning each translator board test point of FIG. 1 to an appropriate one of the grid points; and FIG. 3 depicts an array created during execution of the program of FIG. 2.

DETAILED DESCRIPTION

Figure 1:
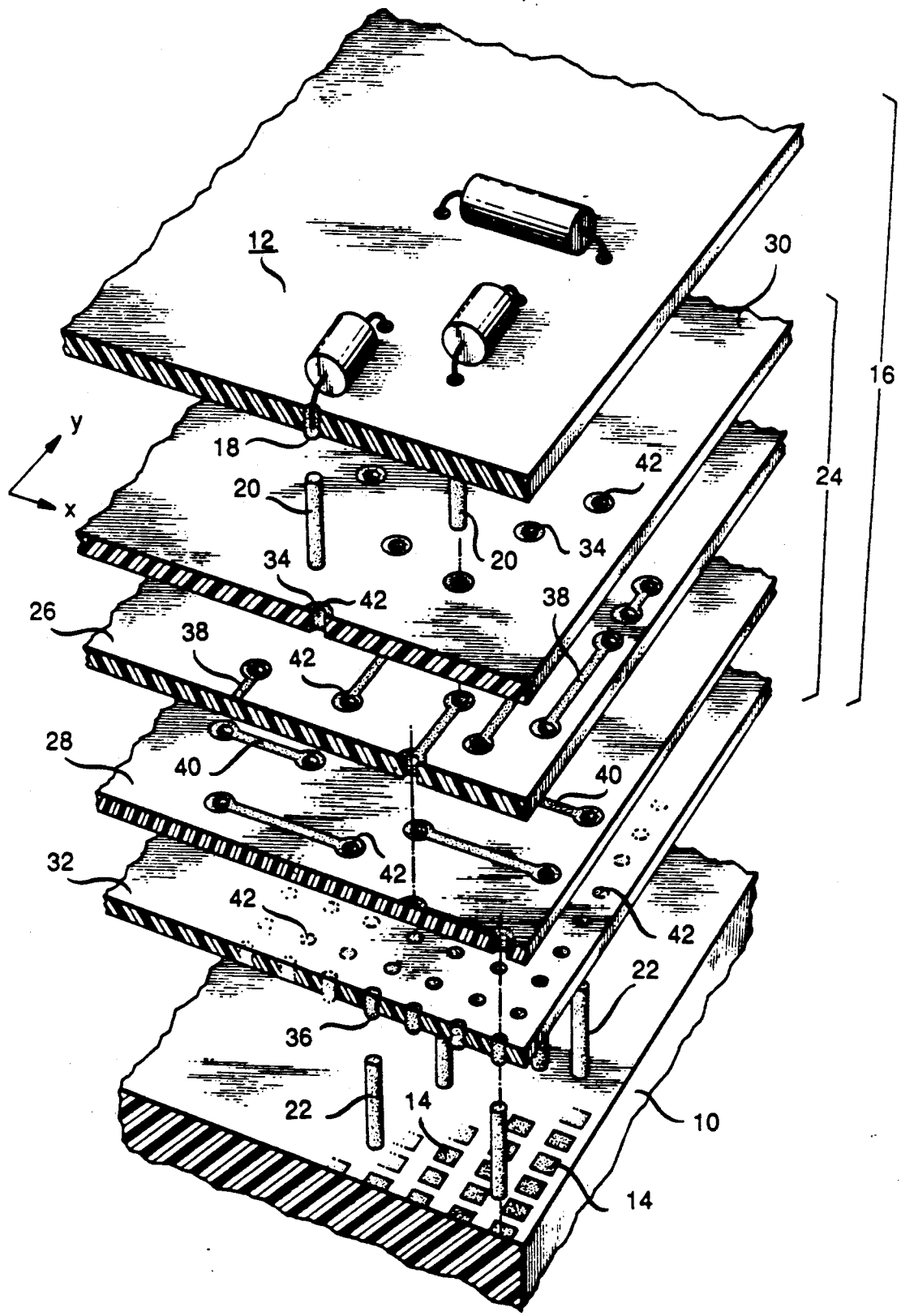
FIG. 1 is an exploded perspective view of a prior art test fixture which includes a translator board having a set of test points and a set of grid points on opposed surfaces.

FIG. 1 shows a portion of a prior art testing machine 10 for testing a circuit board 12 by launching, from a set of contacts 14 on the machine, at least one test signal which is input through a test fixture 16 to at least one node 18 on the circuit board. As the test signals are being launched, the testing machine 10 recovers, through the test fixture 16, the signals (if any) appearing, at one or more other nodes 18 on the circuit board 12, in response to the launched test signals. The characteristics of the response signals recovered by the testing machine 10 from the circuit board 12 are indicative of whether the circuit board is operating properly.

In practice, the test fixture 16 is needed to couple the circuit board 12 to the testing machine 10 because the nodes 18 on the circuit board are randomly spaced, and do not each register with the testing machine contacts 14 which are uniformly spaced. The test fixture 16 is conventional in its construction and is comprised of a first and second set of electrically conductive pins 20 and 22, each mounted in, so as to extend beyond, a separate one of a set of insulative panels (not shown). The pins 20 of the first set are arranged so that each has a first end in contact with a separate one of the nodes 18 on the circuit board 12 into which test signals are launched and response signals recovered. The pins 22 of the second set are arranged so that each has a first end in contact with a separate one of the testing machine contacts 14. Rather than employ each of the pins 22 to make contact with the testing machine contacts 14, flexible metal connectors (not shown) could be employed instead.

The pins 20 are selectively coupled to the pins 22 via a translator board 24 so that each node 18 is coupled to an appropriate one of the testing machine contacts 14. A testing machine contact 14 is deemed appropriate for a given one of the nodes 18 if the contact can transmit and/or receive signals of the correct logic family (TTL, ECL, etc.) for the node. In practice, each contact 14 on the testing machine 10 can only transmit and receive signals of a particular logic family. Thus, for the test and response signals of a particular logic family to be launched into, and recovered from, respectively, a particular node 18 by a particular contact 14 on the testing machine 10, the contact must be of the same logic family.

There is another constraint which must be satisfied in order for a given testing machine contact 14 to be deemed appropriate for a given node 18. In practice, the testing machine 10 is usually provided with a large number of contacts 14, usually well in excess of the number of nodes 18 on the circuit board 12. To reduce the cost and complexity of the testing machine 10, the contacts 14 are often multiplexed. Thus, in order for a particular one of the contacts 14 to be appropriate for a given node 18, the contact cannot be multiplexed with another which is to be in contact with the circuit board 12 at the same time.

As seen in FIG. 1, the translator board 24 is comprised of a pair of inner layers 26 and 28 sandwiched between a pair of outer layers 30 and 32, each layer consisting of thin sheet of insulative circuit board material such as FR-4 or the like. The outer layers 30 and 32 have a plurality of metallized areas 34 and 36, respectively, hereinafter referred to as test points, and grid points, respectively, on their exposed major surfaces. The test points 34 and the grid points 36 are each arranged to contact the other end of a separate one of the pins 20 and 22, respectively.

A connection between each test point 34 and grid point 36 is provided by the combination of a longitudinal metallized path 38 and a latitudinal metallized path 40 which run orthogonally to each other on the layers 26 and 28, respectively. Metal-plated vias 42 are provided to connect a first end of each longitudinal path 38 to a first end of each latitudinal path 40 and to connect the other end of each path to a separate one of test and grid points 34 and 36, respectively.

As indicated, a major difficulty in fabricating the test fixture 16 is "routing" the translator board 24 so that each test point is connected to an appropriate one of the grid points by a separate one of the longitudinal and latitudinal paths 38 and 40. Routing (i.e., laying out) the longitudinal and latitudinal paths 38 and 40 is a straightforward task once the pairings between the test points 34 and the grid points 36 are known. The major difficulty in routing the translator board 24 is in pairing the test points 34 and the grid points 36 so each test point 34 is assigned to the closest appropriate grid point.

FIG. 2 illustrates a flow chart diagram of a program according to the invention which, when executed by a digital computer (not shown), serves to assign each test point 34 of FIG. 1 to the closest appropriate grid point 36 of FIG. 1. Referring to FIG. 2, the program is initiated by executing step 44 whereupon the location (i.e. the x and y coordinates) of the test points 34 on the layer 30 (both of FIG. 1) are read from a data base (not shown) containing such information and are thereafter stored in a memory (not shown). For reasons which will become clear hereinafter, the data representing the locations of the test points 34 are stored in vector form, with each vector containing the x coordinate of those test points which lie within a separate one of a plurality of bands of discrete y values, each band being $\Delta y$ wide. The value of $\Delta y$ is selected in accordance with the y dimension of the translator board 24 to insure that the bands are of uniform height. In addition to storing the coordinates of the test points 34 in the vector form just described, the exact coordinates of the test points are also retained.

After step 44, the coordinates of the grid points 36 of FIG. 1 are read from the data base and the values are stored in the memory during step 46. Next, step 48 is executed whereupon the grid points 36 are mapped into an array. In actuality, the array into which grid points 36 are mapped consists of a matrix of memory locations or cells (not shown) each storing those grid points whose coordinates lie within a separate one of a plurality of uniformly sized areas on the layer 32 of FIG. 1. Referring to FIG. 3, it is useful to visualize the matrix of memory locations into which the grid points 36 are mapped as an array 49a of uniformly sized cells 49b, each $\Delta x$ wide and $\Delta y$ high where $\Delta x$ is selected in accordance with the x dimension of the translator board to assure that the cells are of a uniform length and $\Delta y$ is the same dimension used to index the test points 34.

As discussed earlier, the grid points 36 are uniformly arranged on the layer 32 of FIG. 1 to correspond with the uniformly spaced testing machine contacts 14. Hence, the cells 49b in the array 49a of FIG. 3 contain an equal number of grid points 36, each grid point appearing in the cell which encompasses an area in the corresponding area on the translator board layer 32 where the grid point is situated. Typically, $\Delta x$ and $\Delta y$ are selected so the cells 49b in the array 49a each contain four grid points 36 apiece. By varying the size of Δx and Δy, the number of grid points 36 within each cell 49b can be altered.

As may be appreciated by those skilled in the computer arts, present day digital computers of the type used to execute the program of FIG. 2 have a finite resolution. Because of the finite resolution of present day computers, it is desirable to simplify identification and indexing of the test points 34 by referencing each according to its x coordinate and the range of y coordinates in which the exact value of the y coordinate of the test point is found. For the same reason, the grid points 36 are referenced, not by their exact x and y coordinates (although available), but by the range of x and y coordinates (i.e., the particular cell 49b) in which the x and y coordinates of the grid point are found. Such indexing does lead to a degree of uncertainty, but it does not adversely affect the pairings of the test points 34 and the grid points 36, as will become apparent hereinafter.

Following step 48, step 50 is executed and a successive one of the test points 34, beginning with the first one in the list, is mapped into the array 49a of FIG. 3. Each test point, when mapped into the array 49a, will invariably lie at the boundary between a pair of cells 49b (rather than inside of either of them). Usually, the mapped test point 34 lies at the corner between four cells 49b as seen in FIG. 3.

After the test point 34 has been mapped into the array 49a, a search is conducted to locate a predetermined number of the grid points 36 which are both close to, and appropriate for, the mapped test point. The search is begun by executing step 52, whereupon the area (i.e., the number of cells 49b) within the array 49a, which is to be initially searched, is established. Typically, it is desirable to initially search each of the four cells 49b lying, at least in part, immediately Southwest (SW), Southeast (SE), Northwest (NW), and Northeast (NE), respectively, from the mapped test point 34. In instances where it is desirable to assign the grid points 36 to the test points 34 so the path linking each is of at least a predetermined length, a different initial search area would be selected.

Once the initial search area in the array 49a is established, step 54 is executed, whereupon the cells 49b within the search area are identified and their identities are recorded. Depending on the location of the mapped test point 34, there may not always be a separate cell 49b lying SW, SE, NW and NE of the mapped test point 34. Thus, if no cell 49b lies along one of the four search directions, the cell identity for that direction is left blank. Following step 54, step 56 is executed and the direction in which the search is to be conducted (i.e., which of the four cells 49b in the search area is to be examined) is determined. Typically, the search is begun in the SW direction first.

Next, step 58 is executed and the first cell 49b in the search area lying along the search direction is sought. Upon initial execution of step 58, the cell 49b lying at least in part immediately SW of the mapped test point 34 is sought. Following step 58, a check is made during step 60 to determine whether a cell 49b was indeed found in the search direction. As indicated, a cell 49b may not necessarily be found in the search direction, depending on the location of the mapped test point 34. Assuming that a cell 49b was found along the search direction, then step 62 is executed, whereupon the exact coordinates of the next successive grid point 36, in the cell beginning with the first one, are read into a temporary buffer (not shown).

After step 62, step 64 is executed, whereupon a check is made to determine whether the grid point 36 read into the buffer during step 62 is of the proper logic family for the mapped test point 34. Each grid point 36 is assigned to the logic family of the corresponding testing machine contact 14 connected to the grid point via a separate one of the pins 22. If the grid point 36 is of the proper logic family for the mapped test point 34, then the grid point is temporarily assigned to the mapped test point and this assignment is recorded during step 66. Thereafter, step 68 is executed, whereupon the direction along which the initial search area is next searched is changed.

When the grid point 36 examined during 64 is not of the proper logic family for the mapped test point 34, then instead of branching to step 66, program execution branches to step 70. During step 70, a check is made to determine if there are any more grid points 36 within the cell 49b found during step 60. If there are additional grid points 36 within this particular cell 49b, then program execution branches back to step 62, whereupon the next grid point is read in. However, when no additional grid points 36 are found within the cell 49b, then program execution branches back to step 58, whereupon the next cell 49b lying along the search direction is sought. Since the initial search area is established to include only the four cells 49b lying immediately SW, SE, NW and NE of the mapped test point 34, after the initial execution of step 58, there will be no more cells in the search area lying in the search direction. Therefore, upon each subsequent execution of step 58, the next cell 49b sought is the one which lies outside of the initial search area along the search direction. In this way, the initial search area is effectively expanded.

Each time step 58 is subsequently executed, step 60 is executed immediately thereafter to check if the next cell 49b has been found in the search direction as described previously. Upon the execution of step 60, it is possible that no cell 49b may lie in the search direction, as may occur if the mapped test point 34 lies close to a corner of the array 49b. When no cell 49b is found in the search direction after step 60, then program execution branches to step 72, whereupon a null condition (i.e., no appropriate grid point 36 was found in the search direction) is reported. Following step 72, program execution branches to step 68 which was described previously.

After executing step 68, program execution proceeds to step 74, whereupon a check is made to determine whether a search has been undertaken in the new direction. If a search has not been undertaken in the new direction, then program execution branches back to step 58, whereupon the search area is effectively expanded to include the next closest cell in the search direction. However, when the search area has already been expanded in the new direction (indicating that the SW, SE, NW and NE directions have already been searched), then program execution branches to step 76.

Upon the execution of step 76, a check is made whether there are any non-nulls, that is, whether any of the grid points 36 have been temporarily assigned to the mapped test point 34 during step 66. If even one grid point 36 has been temporarily assigned to the mapped test point 34, then program execution branches to step 78. Upon the execution of step 78, the grid points 36 temporarily assigned to the mapped test point 34 are compared to each other to determine which is the "best" one. Ideally, the mapped test point 34 will have four grid points 36 temporarily assigned thereto, each lying SW, SE, NW and NE of the mapped test point. Of the grid points 36 assigned to the mapped test point, the "best" grid point is the one whose path to the mapped test point 34 satisfies a predetermined minimization constraint. Upon finding the "best" grid point 36, the search direction which yielded this grid point is recorded.

In a preferred embodiment, the "best" grid point 36 of those temporarily assigned to the mapped test point 34 is the one which is connected to the mapped test point by the combination of the shortest longitudinal path 38 and longest latitudinal path 40 or vice versa. Stated another way, the best grid point 36 is the one which yields the smallest product of dx·dy where dx and dy are the x and y distances, respectively, between the grid point and the mapped test point 34, using the exact coordinates of each.

Choosing the grid point 36 so as to maximize the length of the longitudinal path 38 relative to the latitudinal paths 40 or vice versa, tends, in the aggregate, to equalize the total number of longitudinal and latitudinal paths. By equalizing the total number of longitudinal and latitudinal paths 38 and 40, the efficiency by which the paths can be routed on the layers 26 and 28, respectively, by a conventional channel routing program is maximized. Maximizing the efficiency of the routing of the longitudinal and latitudinal paths 38 and 40 on the layers 26 and 28, respectively minimizes the cost of fabricating the translator board 24.

After step 78, step 80 is executed and a check is made to determine whether the "best" grid point 36 is multiplexed with another grid point which is to be active at the same time. If so, then the grid point 34 is not appropriate and, therefore, program execution branches to step 82 and the grid point previously identified as the "best" one is now disqualified. Once the "best" grid point 36 has been disqualified, then step 84 is executed, at which time, the search direction is changed to coincide with the search direction along which the just-disqualified grid point 36 was found. For example, if the just-disqualified grid point was found by searching the search area along the SE direction, then the search direction is changed during step 84 to the SE direction.

Following step 84, program execution branches back to step 58, during which the array 49a is searched in the newly-selected search direction to find the next cell 49b lying along this direction from the mapped test point 34. As should be appreciated, after disqualification of what was thought to be the "best" grid point 36, the array 49a is searched in the direction which previously yielded this grid point. Searching in this direction tends to minimize the amount of time spent to find the next best grid point 36.

It should be noted that the multiplexing of the best-found grid point 36 is checked during step 80 which is executed well after step 64 during which the logic family of the grid point is examined. The reason for not performing the multiplexing check at the same time the logic family of the grid point 36 is examined is that checking the multiplexing of the grid point is relatively expensive, in terms of the time required to make such an examination. Thus, greater efficiency is gained by checking the multiplexing of the best-selected grid point during step 80, rather than checking the multiplexing of every grid point read in during step 62.

If, following step 80, the multiplexing of the grid point 36 is found to be acceptable, then the grid point previously picked as the "best" one is now permanently assigned to the mapped test point 34 during step 86. Once the grid point 36 has been permanently assigned to the mapped test point 34, both are then removed from the array 49b. Thereafter step 88 is executed, whereupon a check is made to determine if the test point 34 that had been mapped into the array 49b is the last one in the list. If so, then program execution branches to step 90, whereupon program execution stops since an assignment has been made, or has been attempted, between each of the test points 34 and the grid points 36. Should there be more test points 34 in the list, then after step 88, program execution branches back to step 50, whereupon the next test point is mapped into the array 49a.

The foregoing describes a technique for assigning each of a plurality of test points 34 to an appropriate one of a plurality of grid points 36. Although in a preferred embodiment, the test points 34 and the test points 36 lie on a separate one of the outer layers 30 and 32 of the translator board 24, the technique could also be used when the test points and the grid points lay on the same layer. In the case where the test points 34 and the grid points 36 lie in the same plane, an electrostatic routing technique, as described in U.S. Pat. No. 4,642,890, issued in the name of C. D. Hechtman et. al, and assigned to an affiliate of the instant assignee, may be used to lay out the paths between grid points and test points once the pairings have been made.

It is to be understood that the above-described embodiments are merely illustrative of the principles of the invention. Various modifications and changes may be made thereto by those skilled in the art which will embody the principles of the invention and fall within the spirit and scope thereof.

We claim:

1. A method for assigning at least one test point at a fixed location on a substrate to an appropriate one of a set of grid points at fixed locations on the same substrate so that a path can be routed therebetween, comprising the steps of:

(a) mapping the grid points, which are at fixed locations, into an array;

(b) mapping the test point, which is at a fixed location, into an array;

(c) establishing the initial size of an area within the array surrounding the mapped test point which is to be searched for grid points, the initial size being less than the size of the array;

(d) searching the area to locate a predetermined number of the grid points which are closest to the mapped test point;

(e) designating, among the located grid points, the one which best satifies a predetermined minimization constraint;

(f) checking whether the designated grid point is appropriate for the test point, and if so, then permanently assigning the grid point to the test point;

(g) expanding the search area in the direction along which the designated grid point lies from the mapped test point;

(h) repeating the steps of (d), (e) and (f) until the search area has been expanded to an edge of the array; and wherein in step (e) among the located grid points, the one which is designated achieves the smallest product of dx dy where dx and dy are the distances, along each of a pair of coordinate axes, between the grid point and the mapped test point.

2. The method according to claim 1 wherein the initial size of the area to be searched is established to include four sub areas which each lie, at least in part, southeast, southwest, northwest and northeast, respectively, of the mapped test point.

3. The method according to claim 2 wherein a grid point appropriate for the mapped test point is located in each of the four sub areas.

4. The method according to claim 1 wherein each of a plurality of test points is assigned to an appropriate one of the grid points by successively mapping each test point into the array and subsequently removing each grid point once permanently assigned to a test point.

5. A method for pairing each of a successive one of a plurality of test points arranged at fixed locations on a first exposed surface of a translator board to an appropriate one of a plurality of grid points arranged at fixed locations on a second opposed surface of the board so that a path may be routed therebetween, the method comprising the steps of:

(a) mapping the grid points, which are at fixed locations, into an array of uniformly sized cells such that each grid point is situated in the array in accordance with its approximate location on the second translator board surface;

(b) successively mapping each test point, which is at a fixed location, into the array such that each test point is situated in the array in accordance with its approximate location on the first translator board surface;

(c) establishing the initial size of an area within the array surrounding the mapped test point which is to be searched for grid points, the initial size being less than the size of the array;

(d) searching the search area to locate a predetermined number of grid points which are closest to the mapped test point;

(e) designating, among the located grid points, the one which is situated from the mapped test point such that the product of dx·dy is a minimum where dx and dy each represent the distance, along each of a pair of coordinate axes, from the grid point to the mapped test point;

(f) checking whether the designated grid point is appropriate for the mapped test point, and if so, then permanently assigning the grid point to the test point and thereafter removing the grid point from the array before mapping the next test point into the array; otherwise (g) expanding the size of the initial search area in the direction along which the designated grid point lay from the mapped test point; and (h) repeating the steps of (d), (e) and (f) until the search area has been expanded to an edge of the array.

6. The method according to claim 5 wherein the initial size of the area to be searched is established to include those four cells which each lie, at least in part, immediately southeast, southwest, northwest and northeast, respectively of the mapped test point.

7. The method according to claim 6 wherein the grid point closest to the mapped test point is located in each of the four cells in the search area.

* * * * *